(12) United States Patent
Leach

(10) Patent No.: US 6,399,278 B1
(45) Date of Patent: Jun. 4, 2002

(54) PHOTOSENSITIVE COMPOSITIONS AND CLEAN RUNNING PHOTOPOLYMER PRINTING PLATES

(76) Inventor: Douglas R. Leach, 5 E. Aldine Dr., Hockessin, DE (US) 19807

( * ) Notice: Subject to any disclaimer, the term of this patent is extended or adjusted under 35 U.S.C. 154(b) by 1539 days.

(21) Appl. No.: 08/664,318

(22) Filed: Jun. 10, 1996

Related U.S. Application Data

(63) Continuation of application No. 08/355,122, filed on Dec. 13, 1994, now abandoned.

(51) Int. Cl.$^7$ ............................................... G03F 7/028
(52) U.S. Cl. ........................ 430/284.1; 430/93; 430/92; 430/96
(58) Field of Search ........................ 430/284.1; 522/92, 522/93, 96

(56) References Cited

U.S. PATENT DOCUMENTS

| | | | |
|---|---|---|---|
| 3,658,531 A | 4/1972 | Kurtz .......................... | 96/36.3 |
| 3,850,770 A | 11/1974 | Juna et al. ................ | 204/159.19 |
| 3,948,665 A * | 4/1976 | Richter et al. ............ | 430/284.1 |
| 3,960,572 A | 6/1976 | Ibata et al. ................... | 96/115 |
| 4,006,024 A | 2/1977 | Ibata et al. ................... | 96/115 |
| 4,057,431 A | 11/1977 | Finelli et al. ................. | 96/115 |
| 4,133,723 A | 1/1979 | Howard ....................... | 204/15 |
| 4,139,436 A | 2/1979 | Jasani ................... | 204/159.19 |
| 4,202,696 A | 5/1980 | Takahashi et al. .......... | 430/306 |
| 4,209,582 A | 6/1980 | Merrill et al. .............. | 430/308 |
| 4,221,646 A | 9/1980 | Finelli et al. .......... | 204/159.19 |
| 4,264,705 A | 4/1981 | Allen .......................... | 430/271 |
| 4,387,139 A | 6/1983 | Herwig et al. .............. | 428/423 |
| 4,716,094 A | 12/1987 | Minonishi et al. .......... | 430/284 |
| 4,992,524 A * | 2/1991 | Coady et al. .................. | 528/49 |
| 5,288,571 A | 2/1994 | Nakamura et al. ............ | 430/18 |

FOREIGN PATENT DOCUMENTS

| | | | |
|---|---|---|---|
| EP | 0263366 | * 4/1988 | |
| WO | 092-6846 | * 4/1992 | .................. 522/96 |

* cited by examiner

Primary Examiner—Cynthia Hamilton
(74) Attorney, Agent, or Firm—Carmody & Torrance LLP

(57) ABSTRACT

Clean running printing plates for flexographic printing may be prepared by the co-photopolymerization of a mixture comprising a liquid, acrylate or methacrylate-terminated polyurethane oligomer, an ethylenically unsaturated compound, and a photopolymerization initiator. The liquid oligomer is preferably the acrylated or methacrylated reaction product of a diisocyanate, a liquid hydrophobic polyalkylene oxide, and a diol that is at least one of polypropylene oxide and a copolymer of ethylene oxide and propylene oxide, where reaction with a hydroxy-containing acrylate or methacrylate compound incorporates terminal acrylate or methacrylate groups into the oligomer. The photopolymerizable blend may be used to form printing plates for flexographic printing, where the plates have a reduced tendency to pick up paper fibers, dust and dried ink during the printing process. Methodology for preparing the printing plates, and printing with the printing plates of the invention is also provided.

23 Claims, No Drawings

PHOTOSENSITIVE COMPOSITIONS AND CLEAN RUNNING PHOTOPOLYMER PRINTING PLATES

This application is a continuation, of application Ser. No. 08/355,122 Dec. 13, 1994, now abandoned.

FIELD OF THE INVENTION

The present invention relates to a photosensitive resin composition, to printing plates made therefrom, a method of making the printing plate, and to a method of printing therewith.

BACKGROUND OF THE INVENTION

In flexographic printing, also known as relief printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

The demands placed on flexographic printing plates are numerous. For instance, a flexographic printing plate must have sufficient flexibility (a mechanical property) to wrap around a printing cylinder, yet be strong enough to withstand the rigors experienced during typical printing processes. Further, the printing plate should possess a low hardness to facilitate ink transfer during printing. It is also important that the surface of the printing plate be dimensionally stable during storage. For example, some compositions used for making plates have shown inferior stability properties in that they become tacky and pasty during storage.

It is also required that the printing plate have a relief image that has a chemical resistance against the aqueous-based ink or alcohol-based ink which is usually used in flexographic printing. It is further desired that the physical and printing properties of the printing plate are stable and do not change during printing. In order to maintain high quality, clear printing during a run, it is highly desirable that a printing plate not pick up deposits of paper fibers and dried ink which would fill in reverse areas of the plate and deposit at the edges of the printing areas of the plate. When plates pickup excessive deposits during printing, the printing press must be shut down periodically during the run to clean the plates, resulting in a loss of productivity.

In the early days of flexographic printing, a rubber printing plate was produced by direct engraving on a rubber plate. Another early mode of preparing flexographic plates was to first produce an original engraved plate by etching of a metallic plate, then form a plastic matrix in the form of the metallic plate, followed by pouring rubber into the matrix plate and vulcanizing the rubber. These methods for preparing what may be termed a conventional printing plate, are complex and require considerable expertise to provide a satisfactory product. Since these manufacturing processes require many steps, they are expensive and very time-consuming.

In order to overcome the shortcomings of conventional plates, there has recently been proposed a method of producing a flexographic printing plate from a photosensitive, also known as photopolymerizable or photocurable, resin composition. These so-called photopolymer plates are rapidly coming into general use in various fields of printing because of their better handleability, higher productivity, lower price, and improved printing performance as compared with a conventional printing plate.

Photopolymerizable resin compositions generally comprise an elastomeric binder, herein sometimes referred to as a prepolymer or an oligomer, at least one monomer and a photoinitiator. To prepare the plates, there is generally formed a photopolymerizable layer interposed between a support and one or more cover sheets that may include slip and release films to protect the photosensitive surface. Prior to processing the plate, the cover sheets may be removed, and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer removes the unexposed areas of the photopolymerizable layer leaving a printing relief which can be used for flexographic printing.

Many different elastomeric materials have been investigated for the preparation of the photopolymer plates. These include polyamide-based photopolymer (containing a polyamide as an essential component which dissolves or swells in a washout solution (typically, water, alkaline aqueous solution, or alcohol), a polyvinyl alcohol-based photopolymer (containing polyvinyl alcohol as an essential component), a polyester-based photopolymer (containing a low-molecular weight unsaturated polyester as an essential component), an acrylic-based photopolymer (containing a low-molecular weight acrylic polymer as an essential component), a butadiene copolymer-based photopolymer (containing a butadiene or isoprene/styrene copolymer as an essential component), or a polyurethane-based photopolymer (containing polyurethane as an essential component).

Methacrylate- or acrylate-terminated polyurethane oligomers diluted with various acrylate or methacrylate monomers, along with a photoinitiator, are described in U.S. Pat. Nos. 4,006,024 and 3,960,572. The entire disclosures of U.S. Pat. Nos. 4,006,024 and 3,960,572 are incorporated herein by reference. The polyurethane oligomers of the '024 and '572 patents are derived from a diisocyanate such as toluene diisocyanate (TDI) and various polyester polyols or polyether polyols such as polypropylene glycol adipate, polyethylene oxide/propylene oxide copolymer, or a mixture thereof. The resultant printing plate can be used for printing on a wide variety of substrates, including corrugated board, various types of paper bags, and various types of cardboard packaging. Unfortunately, the photopolymer products described in the '024 and '572 patents can pick up significant amounts of paper fibers, dust and dried inks, and thus do not print cleanly and must be cleaned often during a print run.

U.S. Pat. Nos. 4,057,431, 4,139,436, 4,221,646 and 3,850,770, which are all incorporated in their entirety by reference, all teach the use of photosensitive ethylenically unsaturated polyether urethanes for the production of printing plates. In each of these patents, the polyether is either polyethylene oxide, polypropylene oxide or a copolymer of the two.

The use of ethylene oxide/propylene oxide copolymer as the sole diol to prepare a polyurethane oligomer causes a photopolymer printing plate formed therefrom to be swelled by contact with the aqueous inks used in flexographic printing. While a small amount of swelling can be tolerated, photopolymer plates made from urethane oligomers incorporating only ethylene oxide/propylene oxide copolymers as diols demonstrate a degree of swelling upon contact with water that characters, lines and halftone dots become unacceptably large, thus distorting the print beyond tolerable levels.

In general, the maximum allowable amount of swell of a printing plate upon exposure to water, or a water-based flexographic ink, for a 24-hour period at 25° C. is a 10% gain in either the weight of the plate sample or a 10% gain in its thickness. More preferably, the maximum allowable increase in either weight or thickness due to swelling by water, or a water-based flexographic ink is 6% after a 24-hour exposure. An average percent swell in water of a flexographic printing plate made from a photosensitive resin comprising a polyurethane oligomer made from an ethylene oxide/propylene oxide block containing 30% ethylene oxide by weight as the sole diol is 15%.

U.S. Pat. No. 5,228,571, which is incorporated herein by reference in its entirety, teaches the use of photosensitive ethylenically unsaturated polyether urethanes for the production of printing plates wherein at least 20% of the polyether diol is specifically poly(tetrahydrofuran) (polyTHF). Unfortunately, polyTHF is a crystalline solid at room temperature, thus making it difficult to handle in a production setting. Even more unfortunate is that the polyurethane oligomers as well as the final photosensitive resin compositions from which the printing plates are made, are both solids when polyTHF is incorporated therein according to the '571 patent. Over time, compositions containing polyTHF crystalize thereby forming a solid mass which need to be melted prior to use.

The handling of solid polyTHF is troublesome in the manufacturing site, where polyTHF is incorporated into the oligomer. Typically, the polyTHF must be melted in a reservoir, and then transferred around the production facility in heated pipes. Perhaps even more troubling is that the final photosensitive resin composition incorporating polyTHF according to U.S. Pat. No. 5,288,571 is itself a solid, and must be melted by the plate manufacturer prior to use.

The photosensitive resins obtained from urethane oligomers comprising polyTHF often solidify upon storage in unheated warehouses. This crystallization of the liquid photosensitive resin is particularly troublesome if the photosensitive resin contains solid tack reducing additives, as disclosed in U.S. Pat. No. 4,716,904, (which is incorporated herein by reference in its entirety) which themselves have a tendency towards crystallization, and which may require heating to fully redissolve and keep from crystallizing upon storage in a warehouse.

There is a need in the art for liquid photosensitive resins that are not susceptible to freezing or crystallization at ambient or sub-ambient temperatures, and yet meet or exceed the printing quality and durability demanded by the printing industry.

SUMMARY OF THE INVENTION

The present invention provides a photosensitive resin composition comprising (i) a urethane oligomer; (ii) an ethylenically unsaturated compound; and (iii) a photopolymerization initiator. The urethane oligomer (i) is the reaction product of (a) polyether diol compounds X and Y, (b) a polyisocyanate, and (c) a hydroxy-functionalized acrylate or methacrylate. The diol compound X has the formula H—(—O—$R^1$)$_m$—OH wherein $R^1$ is independently selected from the group consisting of ethylene and iso-propylene, m is an integer between 5–100 inclusive, and the total number of carbon atoms in X divided by m is at least 2.5. The diol compound Y has the formula H—(—O—$R^2$—)$_n$—OH wherein $R^2$ is independently selected from the group consisting of ethylene, propylene and butylene, $R^2$ is independently substituted with 0–5 $C_1$–$C_4$ aliphatic groups, n is an integer between 5–100 inclusive and the total number of carbon atoms in Y divided by n is at least 3.5. Diol compound Y has a melting point equal to or less than 22° C., and contributes at least 15 weight percent of the polyether diol compounds X and Y.

Another aspect of the invention is a photoresin printing plate for use in printing a substrate, where said printing plate comprises a layer of photosensitive resin coated on a support, subjected to image-wise exposure by actinic radiation, and subsequently developed. The photosensitive resin is the inventive composition described above.

Yet another aspect of the invention is a method for preparing the above photoresin printing plate. The method comprises the steps of preparing the photosensitive resin composition described above, and then preparing a coated support by applying a layer of said resin composition onto a transparent support. The coated support is then cured by subjecting the coated support to image-wise exposure to actinic radiation, to provide a cured coated support. The cured coated support is then developed to provide the printing plate.

A further aspect of the invention is a method for printing a substrate which comprises delivering ink to the substrate from the printing plate described above.

DETAILED DESCRIPTION OF THE INVENTION

The photosensitive resin composition of the invention comprises a urethane oligomer, an ethylenically unsaturated compound, and a photopolymerization initiator. The urethane oligomer is formed by the reaction of (a) polyether diol compounds X and Y, (b) a polyisocyanate, and (c) a molecule having at least one hydroxyl group and at least one acrylate or methacrylate group, also known as a hydroxy-functionalized acrylate or methacrylate.

The urethane oligomer of the invention, also referred to herein as a polyurethane oligomer, is prepared from a mixture comprising polyether diol compounds X and Y, wherein Y comprises at least 15% of the mixture, as measured on a weight basis. The polyether diol compound X is characterized in having the formula H—(—O—$R^1$)$_m$—OH wherein substantially all $R^1$ units are independently selected from the group consisting of ethylene (—$CH_2$—$CH_2$—) and iso-propylene (—$CH(CH_3)$—$CH_2$—) and m is an integer between 5–100 inclusive.

Suitable polyether diol compounds X may be prepared by the copolymerization of ethylene oxide and propylene oxide, or by the polymerization of propylene oxide. It is understood by those in the art that both ethylene oxide and propylene oxide are commonly contaminated with small amounts of additional epoxidized olefins, and thus a diol compound X, as prepared from ethylene oxide and propylene oxide, may have a minor amount of $R^1$ units other than ethylene and iso-propylene. Thus, diol compound X is defined as being made substantially from ethylene and iso-propylene $R^1$ units, in order to acknowledge the potential presence of contaminating epoxidized olefins when diol compound X is prepared from propylene oxide and propylene oxide/ethylene oxide.

Preferably, the polyether diol compound X has a majority of iso-propylene units, such that the total number of carbon atoms in X divided by m is at least 2.5. More preferably, diol compound X has about 15–50 weight percent ethylene $R^1$ units and about 85–50 weight percent iso-propylene $R^1$ units, based on the total weight of $R^1$ units. The preferred polyether diol compound X is a block copolymer of ethylene and iso-propylene $R^1$ units, although random copolymers may also be used. Generally, diol compound X has a melting point equal to or less than 22° C., preferably equal to or less than 20° C., and more preferably equal to or less than 15° C.

It has been observed that diol compound X having between 15 and 50 weight percent ethylene units imparts excellent resilience, strength and tear strength to flexographic printing plates made from photosensitive resins incorporating such a diol compound. However, the presence of such a diol compound also tends to lower the hardness of a plate made therefrom. The presence in an image-wise exposed photosensitive resin of a diol compound X having at least 15% by weight of ethylene units renders the unexposed areas of the photosensitive resin readily removable by washing the exposed photopolymer plate with an aqueous solution of detergent.

A urethane oligomer formed from compound X as the sole diol, upon incorporation into a photosensitive resin composition and subjected to image-wise exposure, provides a printing plate with an unacceptable degree of swelling upon contact with an ink, particularly an aqueous ink. The amount of swelling observed upon contact with water-based inks can be reduced or otherwise controlled by the incorporation of a hydrophobic diol compound Y along with the relatively hydrophilic diol compound X.

Diol compound Y has the formula H—(—O—$R^2$—)$_n$—OH, wherein $R^2$ is independently selected from the group consisting of ethylene, propylene (e.g., —$CH_2CH_2CH_2$—) and butylene (e.g., —$CH_2CH_2CH_2CH_2$—), wherein $R^2$ is substituted with 0–5 $C_1$–$C_4$ aliphatic groups and wherein n is 5–100. Diol compound Y should not have a majority of ethylene or propylene $R^2$ units, otherwise it will tend to be too hydrophilic to be desirable in the photosensitive resin composition of the invention. Thus, the total number of carbon atoms in diol compound Y, divided by the repeating unit n, should be at least 3.5. This criteria provides, for example, for diol compounds Y having 50% propylene and 50% butylene $R^2$ units, or having 25% ethylene and 75% butylene $R^2$ units, etc. The diol compound Y can be a random or block copolymer formed of $R^2$ units.

A preferred diol compound Y is poly(1,2-butylene oxide), also known as polybutylene oxide, i.e., a compound Y wherein substantially each $R^2$ is ethylene substituted with one $C_2$ group. The total number of carbon atoms in polybutylene oxide, divided by the repeating unit n is about 4.

The diol compound Y has a melting point equal to or less than 22° C., preferably equal to or less than 20° C., and more preferably equal to or less than 15° C.

PolyTHF, i.e., diol compound Y wherein $R^2$ is 1,4-butylene, also known as polytetramethylene ether glycol, has a melting point above 22° C., and so is not included within the group of diol compounds Y. Depending on its molecular weight, polyTHF is a crystalline solid having a melting point of between 25° C. and 40° C. Polyurethane oligomers prepared from polyTHF generally are also crystalline solids at ambient temperature. Photosensitive resins comprising polyurethane oligomers containing polyTHF can exhibit crystallization at temperatures as high or higher than room temperature, which is defined as 22° C.

Preferably, the relative amount of diol compounds X and Y to be used in the preparation of the polyurethane oligomer is determined by measuring the swell of a flexible printing plate made from a photosensitive resin composition comprising the polyurethane oligomer. Measurement of swell is readily accomplished by forming a sheet 0.040 inch thick from a photosensitive resin composition, curing the composition by exposure to actinic radiation, and then cutting disks having a diameter of 1 inch from the cured sheet. The disks are weighed and then submerged in water (they are typically more dense than water) at room temperature for 24 hours. After soaking, the disks are removed from the water, immediately patted dry and then reweighed. The difference in the pre- and post-soaking weights, divided by the pre-soaking weight and multiplied by 100, provides a percentage swell ratio for the photosensitive resin composition. The weight gain due to soaking is considered approximately directly proportional to the dimensional distortion experienced by the cured photoresin printing plate upon contact with an aqueous ink.

Desirably, the photosensitive resin compositions, upon curing, have a swell ratio of less than about 10%, preferably less than about 8%, and more preferably less than about 6%. When using a compound X prepared from a reaction mixture comprising 30% by weight ethylene oxide and 70% by weight propylene oxide, a preferred polyol composition would have from about 15% by weight to about 75% by weight of diol compound Y. A more preferred composition would be from about 25% by weight to about 70% by weight diol compound Y.

In order to produce photopolymer resins having a viscosity appropriate for the easy manufacture of flexographic printing plates, and to produce printing plates having the appropriate hardness, tensile strength, elongation, and resilience, it is preferred to use polyether diols having a number average molecular weight from about 500 to about 5000. Thus, the diol compounds X and Y independently have a number average molecular weight of about 500 to about 5,000. By independently, it is meant that the molecular weight of diol compound X is independent of the molecular weight of diol compound Y. More preferably, the number average molecular weight of each polyether diol will be above about 1,000, and more preferably from about 1,500 to about 3,000.

A second component necessary to prepare the urethane oligomer is a polyisocyanate. By polyisocyanate is meant a molecule having at least two isocyanate groups. A preferred polyisocyanate is a diisocyanate, i.e., a molecule having exactly two isocyanate groups, and optionally other functional groups as well. To prepare the urethane oligomer, it is preferred to contact the polyisocyanate with the polyether diol compounds X and Y to prepare an intermediate polyurethane oligomer, which is then contacted with the hydroxy-functionalized acrylate or methacrylate.

A preferred diisocyanate used to prepare the polyurethane oligomer of the invention is an aromatic diisocyanate, although an aliphatic diisocyanate can be used just as well. Typical aromatic diisocyanates include methylene diphenyldiisocyanate (a.k.a. diphenylmethane-4,4', -diisocyanate), meta- and para-xylylene diisocyanate, toluene-2,4-diisocyanate, toluene-2,6-diisocyanate or mixtures of the latter two isomers (a.k.a. 2,4- and 2,6- toluene diisocyanate), naphthalene-1,5-diisocyanate, phenyl benzyl ether 4,4'-diisocyanate and the like.

Aliphatic, including cycloaliphatic diisocyanates may be used as the diisocyanate component of the reaction mixture useful in preparing the urethane oligomer of the invention. Suitable aliphatic diisocyanates include, for example, molecules having 2 to 12 carbon atoms in the aliphatic radical, for example, ethylene diisocyanate, propylene diisocyanate, tetramethylene diisocyanate, hexamethylene diisocyanate, 2,2,4-trimethylhexamethylene diisocyanate and the like.

Suitable cycloaliphatic diisocyanates include, for example, 1,4-diisocyanate-cyclohexane, dicyclohexylmethane-4,4'-diisocyanate (a.k.a. bis-cyclohexylmethylene diisocyanate), isophorone diisocyanate and the like.

It is preferred to react the polyisocyanate in equivalent excess with the diol compounds X and Y, in order that intermediate polyurethane oligomers having isocyanate termination are produced. When the polyisocyanate is a diisocyanate, the molar ratio of diol component to diisocyanate component is preferably between about 1.0:1.08 and 1.0:1.5, and more preferably between about 1.0:1.12 and 1.0:1.3.

Preferably, the reaction between the diol and the diisocyanate is achieved by contacting the reactants in the presence of a catalyst, preferably dibutyltin dilaurate or other such alkyltin catalyst, at an effective concentration of the catalyst, preferably from about 10 to about 20 ppm. A preferred reaction temperature may be about 60° C., at which temperature the reaction time will be approximately 1.5 hours.

After reacting the polyether diols with an excess of diisocyanate, to give an isocyanate-terminated intermediate polyurethane oligomer, the intermediate oligomer is reacted with a hydroxyacrylate or hydroxymethacrylate to introduce terminal ethylenic unsaturation into the oligomer and provide the urethane oligomer of the invention. Preferably, sufficient hydroxy-functionalized acrylate or methacrylate is combined with the intermediate oligomer so that substantially all of the terminal isocyante groups of the intermediate oligomer react with the hydroxyacrylate or hydroxymethacrylate.

Suitable hydroxyacrylates or hydroxymethacrylates include, without limitation, 2-hydroxypropyl acrylate or methacrylate, polypropylene glycol monomethacrylate or monoacrylte or acrylated or methacrylated caprolactone oligomers including acrylated or methacrylated caprolactone dimer. Of these, polypropylene glycol monomethacrylate and acrylated caprolactone oligomer are preferred for producing soft photopolymers necessary for printing on corrugated board or other cellulosic substrate having an irregular surface.

Preferably the urethane oligomer is a liquid at room temperature, that is, it has a melting point at or below 22° C. More preferably, the urethane oligomer has a melting point at or below 20° C., and most preferably has a melting point at or below 15° C.

In a preferred embodiment, the urethane oligomer is the reaction product of a diol compound X which is a block copolymer comprising 15–50 weight percent ethylene $R^1$ units and 85–50 weight percent iso-propylene $R^1$ units, based on the total weight of $R^1$ units, a diol compound Y which is poly(1,2-butylene oxide), a polyisocyanate selected from the group consisting of hexamethylene diisocyanate, trimethylhexamethylene diisocyanate and bis-cyclohexylmethylene diisocyanate, toluene diisocyanate, methylene diphenyldiisocyanate and xylylene diisocyanate, and a hydroxy-functionalized acrylate or methacrylate selected from the group consisting of hydroxypropyl methacrylate, polypropylene glycol monomethacrylate, polypropylene glycol monoacrylate, and acrylated caprolactone oligomers.

The second component of the photosensitive resin composition of the invention is an ethylenically unsaturated compound (ii), also known as a reactive monomer, or simply a monomer. The compound (ii) of the instant invention may be any molecule having one or more photopolymerizable ethylenic groups, where mono- and poly-acrylate or methacrylate compounds, including esters thereof, are preferred ethylenically unsaturated compounds. Preferably, compound (ii) is selected from the group consisting of mono-ester of $C_1$–$C_{22}$ monoalcohol and acrylic acid, mono-ester of $C_1$–$C_{22}$ monoalcohol and methacrylic acid, mono- and di-ester of $C_2$–$C_{22}$ dialcohols and acrylic acid, mono- and di-ester of $C_2$–$C_{22}$ dialcohols and methacrylic acid, mono-, di- and tri-esters of $C_3$–$C_{22}$ trialcohols and acrylic acid, and mono-, di- and tri-esters of $C_3$–$C_{22}$ trialcohols and methacrylic acid. It should be understood that a monoalcohol, also known as a monohydric compound, is a molecule having exactly one hydroxy (—OH) group, in addition to other functionality without limitation. A dialcohol, also known as a dihydric compound, is a molecule having exactly two hydroxy groups. A trialchol, also known as a trihydric compound, is a molecule having exactly three hydroxy groups.

The incorporation into a photosensitive resin composition of a component having two or more ethylenically unsaturated groups in the molecule, increases the hardness of a printing plate prepared from. Therefore, the amount of such a component in a photosensitive resin composition should be controlled so that a printing plate having the desired hardness is obtained. For this reason, it is preferred that the compound (ii) be a mixture of a first component selected from the group consisting of monoacrylate ester and monomethacrylate ester, and a second component selected from the group consisting of polyacrylate ester and polymethacrylate ester, where polyacrylate ester and polymethacrylate ester includes di- and tri- acrylate and methacrylate esters. Preferably, said mixture comprises about 1% to about 20% of said second component, based on the total weight of said mixture of first and second components.

Exemplary compound (ii) molecules that are esters of acrylic acid and/or methacrylic acid with monohydric or polyhydric alcohols, include, for example and without limitation, butyl acrylate or methacrylate, 2-ethylhexyl acrylate or methacrylate, isodecyl acrylate or methacrylate, lauryl acrylate or methacrylate, phenoethoxy acrylate or methacrylate, ethylene glycol diacrylate or dimethacrylate, 2-hydroxyethyl acrylate or methacrylate, hexane-1,6-diol diacrylate or dimethacrylate, 1,1,1-trimethylolpropane triacrylate or trimethacrylate, di, tri, and tetraethylene glycol diacrylate or dimethacrylate, tripropylene glycol diacrylate or dimethacrylate, pentaerythritol tetraacrylate or tetramethacrylate, propoxylated trimethylolpropane mono- di- and tri-acrylate or tri-methacrylate and ethoxylated trimethylolpropane triacrylate or trimethacrylate. Oligomeric polybutadienes with acrylic acid or methacrylic acid, i.e., oligomeric polybutadienes possessing activated, photopolymerizable olefinic double bonds, are also preferred compound (ii) molecules. The ethylenically unsaturated compound (ii) may, and preferably does, comprise more than one ethylenically unsaturated compound.

Preferred compound (ii) molecules are selected from the group consisting of lauryl acrylate, lauryl methacrylate, isodecyl acrylate, isodecyl methacrylate, polypropyleneglycol monoacrylate, polypropyleneglycol monomethacrylate, polypropyleneglycol diacrylate, polypropyleneglycol dimethacrylate, trimethylolpropane triacrylate, trimethylolpropane trimethacrylate, tri(methylolpropane polypropylene oxide) triacrylate, tri(methylolpropane-polypropylene oxide) trimethacrylate. More preferred ethylenically unsaturated compounds (ii) are laurylmethacrylate, polypropyleneglycol monomethacrylate, trimethylolpropane trimethacrylate and tetraethyleneglycol dimethacrylate.

The proportion of compound (ii) in the photosensitive resin formulation of the invention is dictated at least in part by the desired viscosity of the resulting liquid photosensitive resin. The greater the amount of compound (ii) incorporated into the photosensitive resin, the lower the resultant viscosity of the resin, for a given molecular weight of polyurethane oligomer. The viscosity of the photosensitive resin is preferably between 10,000 cps and 100,000 cps, and more preferably between 20,000 cps and 50,000 cps. Most preferably, it is from about 25,000 cps to about 40,000 cps. The amount of compound (ii) required for a given molecular weight urethane oligomer, in order to achieve a given viscosity for the photosensitive resin composition, can be readily determined by one skilled in the art without undue experimentation.

The thickness of a printing plate useful for printing on a corrugated board is typically from about 0.125 inches to about 0.250 inches. The thickness of the relief layer of such printing plate is typically from about 0.040 inches to about 0.125 inches, depending on the thickness of the printing plate. A photosensitive resin having a viscosity as set forth above provides a convenient balance of flow properties in the manufacture of a printing plate having a thickness of about 0.125 inches to about 0.250 inches. When the viscosity is above the given range, the resin composition tends to have undesirable variation in film thickness upon being applied to a support. When the viscosity is below the given range, the resin composition flows so rapidly that it can be hard to contain and handle. Flexographic printing plates for printing on substrates other than corrugated boards may require plate thicknesses other than those above.

Preferably, the compound (ii) is present in from about 10 to about 35 weight percent of the photoensitive resin composition, and more preferably in from about 15 to about 30 weight percent of the mixture.

The number average molecular weights of the polyurethane oligomers produced by reaction of the diol compounds and the polyisocyanate are preferably between about 6,000 and 20,000, and more preferably between about 8,000 and 18,000, and most preferably between about 10,000 and 16,000.

The third part of the photosensitive resin composition of the invention is a photopolymerization initiator. There is no particular limitation with respect to the type of photopolymerization initiator which may be used in the present invention. Therefore, any commonly used photopolymerization initiator customarily used in photosensitive resin compositions may be employed.

As the photopolymerization initiator used in the present invention, use may be made of one or more than one of acenaphthenequinone, acylphosphineoxide, α-aminoacetophenone, benzanthraquinone, benzoin methyl ether, benzoin isopropyl ether, benzoin n-butyl ether, benzoin isobutyl ether, benzophenone, benzoyldimethylketal, benzophenone, benzil dimethyl acetal, benzil 1-methyl 1-ethyl acetal, camphorquinone, chloroacetophenone, 2-chlorothioxanethone, dibenzosuberone, 2,2-diethoxy-2-phenylacetophenone, 2,2-diethoxyacetophenone, 2-dimethoxybenzoyldiphenylphosphine oxide, 2,2-dimethoxy-2-phenylacetophenone, i.e., Irgacure®651 (Ciba-Geigy), 4,4'-bis(dimethylamino)benzophenone, 2-ethylanthraquinone, ethyl 2,4,6-trimethylbenzoylphenyl phosphinate, glyoxyester, hexanophenone, hydroxyacetophenone, 2-hydroxy-2-methylpropiophenone, 2-hydroxy-2-methyl-4'-isopropylisopropiophenone, 1-hydroxycyclohexyl phenyl ketone, 3-ketocoumarin, o-methoxybenzophenone, (methyl)-benzoylbenzoate, methylbenzoyl formate, Michler's ketone, 4'-morpholinodeoxybenzoin, 4-morpholinobenzophenone, alpha-phenylbutyrophenone, sodium 2,4,6-trimethylbenzoylphenylphosphinate, thioxanone, thioxanethone, 10-thioxanthenone, thioxanthen-9-one, tetramethylthiuram monosulfide, 3,3',4,4'-tetra(t-butylperoxicarbonyl)-benzophenone, trichloroacetophenone, 2,4,6-trimethylbenzoyldiphenylphosphine oxide, valerophenone, xanethone, p-diacetylbenzene, 4-aminobenzophenone, 4'-methoxyacetophenone, benzaldehyde, alpha-tetralone, 9-acetylphenanthrene, 2-acetylphenanthrene, 3-acetylphenanthrene, 3-acetylindone, 9-fluorenone, 1-indanone, 1,3,5-triacetylbenzene, xanthene-9-one, 7-H-benz[de]anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene benz[a]anthracene 7.12 diene, etc. Phosphines such as triphenylphosphine and tri-o-tolylphosphine are also operable herein as photoinitiators.

A photopolymerizable photoinitiator can be used alone or in combination with coinitiators, e.g., ethylanthraquinone with 4,4'-bis(dimethylamino)benzophenone, benzoin methyl ether with triphenylphosphine, diacylphosphine oxides with tertiary amines or acyldiarylphosphine oxides with benzil dimethyl acetal.

The amount of the photopolymerization initiator can be any effective concentration which will allow the formation of a floor layer to the flexographic printing plate via a back exposure of a reasonable length of time and the formation of the relief image with the required image resolution. This time is related to the type of image being formed, as well as the thickness of the desired flexographic printing plate. The effective amount of photopolymerization initiator is dependent on the type of initiator chosen.

A concentration range of 0.1–10 wt % photoinitiator is generally preferred. Normally, when the amount of photoinitiator is less than 0.1%, the ultraviolet setting density is lowered and the physical properties of the photopolymer plate are extremely lowered. Typically, when the photoinitiator amount exceeds 10 wt %, no beneficial effect is observed for any property, and the cost of the formulation becomes commercially undesirable.

For 2,2-dimethoxy-2-phenylacetophenone, the photoinitiator(s) is preferably used in the photopolymerizable mixtures in an amount of from about 0.1% to about 5%, more preferably about 0.1% to about 1.5%, and most preferably from about 0.15% to about 0.5%.

According to the preferred embodiment, the photosensitive resin composition comprises a urethane oligomer and a component (ii), where the oligomer is the reaction product of a diol compound X which is a block copolymer comprising 15–50 weight percent ethylene $R^1$ units and 85–50 weight percent iso-propylene $R^1$ units, based on the total weight of $R^1$ units, a diol compound Y which is poly(1,2- butylene oxide), and a polyisocyanate selected from the group consisting of hexamethylene diisocyanate, trimethylhexamethylene diisocyanate and bis-cyclohexylmethylene diisocyanate, toluene diisocyanate, methylene diphenyldiisocyanate and xylylene diisocyanate, and a hydroxy-functionalized acrylate or methacrylate selected from the group consisting of hydroxypropyl methacrylate, polypropylene glycol monomethacrylate, polypropylene glycol monoacrylate, and acrylated caprolactone oligomers, and the compound (ii) selected from the group consisting of lauryl acrylate, lauryl methacrylate, isodecyl acrylate, isodecyl methacrylate, polypropyleneglycol acrylate, polypropyleneglycol methacrylate, polypropyleneglycol diacrylate, polypropyleneglycol dimethacrylate, trimethylolpropane triacrylate, trimethylolpropane trimethacrylate, tri (methylolpropane polypropylene oxide) triacrylate and tri (methylol propane-polypropylene oxide) trimethacrylate.

The photsensitive resin composition is preferably a liquid at room temperature. Thus, it preferably has a melting point equal to or less than 22° C., preferably equal to or less than 20° C., and more preferably equal to or less than 15° C.

To protect the photopolymerizable mixtures from decomposition by thermal oxidation and oxidation by atmospheric oxygen, effective amounts of conventional antioxidants may be added to the mixture. Exemplary antioxidants are, for example, sterically hindered monophenols, such as 2,6-di-tert-butyl-p-cresol (BHT), alkylated thiobisphenols and alkylidenebisphenols, such as 2,2-methylenebis-(4-methyl-6-tert-butylphenol) or 2,2-bis(1-hydroxy-4-methyl-6-tert-butylphenyl) sulfide, hydroxybenzyls, such as 1,3,5-trimethyl-2,4,6-tris-(3,5-di-tert-butyl-4-hydroxybenzyl) benzene, triazines, such 2-(4-hydroxy-3,5-tert-butylanilino)-4,6-bis-(n-octylthio)-1,3,5-triazine, polymerized trimethyldihydroquinone, dibutylzinc dithiocarbamate, dilauryl thiodipropionate and phosphites, such as tris(nonylphenyl) phosphite. BHT is a preferred antioxidant.

Suitable slip additives can be added to the photosensitive resin to reduce the surface tack of the printing plates as is disclosed in, for example, U.S. Pat. No. 4,716,094, incorporated herein by reference in its entirety.

The photosensitive resins of this invention can be cured by exposure to actinic radiation followed by removal of unpolymerized resins by washing with an aqueous solution to provide flexographic printing plates which print cleanly and do not pick up, or which readily release, paper dust and fibers and dried ink. This enables the inventive printing plate to be used for printing on corrugated boards or paper bags or containers made of Kraft paper without requiring frequent cleaning of the printing plate due to the accumulation of dried paper dust and fibers as would be required with printing plates known in the art. Of course, the printing plates of the invention also print well on other cellulosic sheets having less paper dust than typically found on corrugated board, and can be used to print on non-cellulosic substrates as well, e.g. plastic film.

It has been found that photosensitive resins of the instant invention can be cured to provide photoresin printing plates having Shore A hardness, high Bayshore resilience and, optionally, low surface tack, which provide the desirable results described above.

The photosensitive resins of the present invention provide photopolymer printing plates which preferably have a Shore A hardness of between 20 and 65 on the Shore A scale at 20° C., and preferably have a Bayshore resilience, as measured with a Bayshore resiliometer of at least 35% at 23° C.

The preparation of the printing plate from the photosensitive resin of the instant invention can be accomplished by any customary method used with other photosensitive resin. For example, the photosensitive resin may be provided as a layer of uniform thickness between a substrate backing sheet and a cover sheet facing a photographic negative and subjecting the layer to a back exposure and image exposure with actinic radiation, followed by development of the plate.

The substrate backing sheet, also known as the support, can be any flexible material which is conventionally used with photosensitive elements used to prepare flexographic printing plates. Examples of suitable substrate materials include polymeric films such as those formed by addition polymers and linear condensation polymers, transparent foams and fabrics. A preferred substrate is a polyester film; particularly preferred is polyethylene terephthalate. The substrate typically has a thickness from 2 to 10 mils (0.0051 to 0.025 cm), with a preferred thickness of 3 to 8 mils (0.076 to 0.020 cm).

Examples of suitable sources of actinic radiation are sunlight and commercial UV fluorescent tubes, medium pressure, high pressure and low pressure mercury lamps, superactinic fluorescent tubes, pulsed xenon lamps, lamps doped with metal iodides and carbon arc lamps. Preferably, the photopolymer plates used in the present invention are cured with ultraviolet rays having a wavelength of 150–500 nm, especially 300–400 nm, which are generated by a low-pressure mercury lamp, high-pressure mercury lamp, carbon arc lamp, ultraviolet fluorescent lamp, chemical lamp, xenon lamp, or zirconium lamp.

There are several types of apparatus in practical use for the development of photopolymer plates. One forms the relief by blowing off the unexposed part by means of compressed air. Another forms the relief by spraying the washout solution under pressure to the plate. Yet another forms the relief by rubbing a brush against the plate fixed to a flat surface or cylinder, thereby agitating the washout solution against the plate and dissolving the unexposed part in the solution. It is preferred that the photopolymer plate, after curing by exposure to one of the above-mentioned light source, be developed with a developer, also known as a washout solution, which removes the unexposed non-image part. This process forms a relief image on the photopolymer plate. The unexposed part which has been removed by the washout solution remains in the form of emulsion or suspension in the washout solution in the washout bath.

It is preferred to use an aqueous developer. The developer is most desirably water (tap water) having a pH of 5.0–9.0 which may optionally contain an alkaline compound (such as sodium hydroxide or sodium carbonate), surfactant, and water-soluble organic solvent. The addition of a surfactant is desirable for the photopolymer to readily disperse into water and to remain dispersed in water. Preferred surfactants are sodium alkyl-naphthalenesulfonate and sodium alkylbenzenesulfonate. Other examples of the surfactant include anionic surfactants containing a carboxylate, sulfate-ester, sulfonate, or phosphate-ester; nonionic surfactants such as polyethylene glycol derivative, polyhydric alcohol derivative, and sorbitan derivative; cationic surfactants containing a primary, secondary or tertiary amine salt, or a quaternary ammonium salt; and amphoteric surfactants containing an amino acid hydrophilic group or a betaine hydrophilic group. The washout solution should be used at 25°–50° C., preferably 30°–40° C. The concentration of the surfactant in water is not limited, but is generally in the range of about 0.5% to about 4%. While the plate is most often developed by spray washing with the aqueous developer solution, other techniques, including those mentioned above, may be used as well.

After developing, photopolymer flexographic printing plates generally retain at least some degree of surface tackiness, particularly on the "shoulders" of the relief and other non-image areas. Excessive surface tackiness is undesirable in a printing relief. Several methods have been developed to reduce surface tack, and may be applied to the printing plates of the invention. For example, it is well known in the art that exposure to short wavelength irradiation, such as is known from U.S. Pat. No. 4,202,696, incorporated herein by reference in its entirety, can reduce surface tack by postcuring the plate with short wavelength actinic radiation after exposure to certain carbonyl compounds including benzophenone. Likewise, slip additives may be added to photosensitive resin as described in U.S. Pat. No. 4,716,904 to reduce tack of the resulting printing plates. The entire disclosure of U.S. Pat. No. 4,716,904 is incorporated herein by reference.

The printing plate according to the present invention will preferably have a Shore A hardness of 20 to 65 at 20° C. A printing plate having a Shore A hardness at 20° C. of less than about 20 can readily provide a uniform ink coating on the corrugated board but is generally disadvantageous in that the relief of such a printing plate may be distorted even under low printing plate impression. Thus, the printed image could be caused to be thick, leading to a problem that characters, etc., which are printed on the corrugated board could be deformed and become illegible.

On the other hand, a printing plate having a Shore A hardness of more than about 65 generally requires a large printing plate impression for providing a uniform ink coating on the corrugated board. Thus, the flute of the corrugated material would become deformed, thereby causing a lowering of the strength of the corrugated board. From the viewpoint of attaining a good balance between prevention of the thickening of the printed image which causes the characters, etc., to become deformed and illegible and the capability for providing a uniform ink coating on the corrugated board at a moderate plate impression that the flute of the corrugated material of the corrugated board is not deformed, the printing plate more preferably has a Shore A hardness of 25 to 40.

It is generally observed that printing plates of the invention, which preferably use poly(butylene oxide) rather than, for example, poly(THF) to prepare the urethane oligomer, are softer and therefore can print more advantageously on corrugated substrate. The softness of the plate allows the plate to conform more readily to the slight indentations present on the surface of a corrugated board having fluting underneath.

The printing plate of the present invention should also have an impact resilience at 23° C. of 35% or more as measured by a Bayshore resiliometer. If the impact resilience is outside the above-mentioned range, the capability of the printing plate to release the paper dust or the like, which has adhered to the surface of the plate is lowered. Thus, it would become necessary to interrupt the printing operation in order to clean the printing plate.

The following examples are provided to better disclose and teach the preparation of the photosensitive resin compositions and printing plates of the present invention. These examples are for illustrative purposes only, and it must be acknowledged that minor variations and changes can be made without materially affecting the spirit and scope of the invention as recited in the claims that follow.

General Procedures

Printing plate hardness is measured according to ASTM method D2240 using a Shore type A durometer gauge, model 100, available from Shore Instrument and Manufacturing Co.

Printing plate resiliency is reported as Bayshore resilience, as provided by a Bayshore resiliometer operated at 23° C. according to a modification of ASTM method D2632-88 wherein the sample thickness is 0.250 inches. The Bayshore resiliometer may be obtained from Shore Instrument and Manufacturing, or from Precision Scientific Co.

The surface tack of a printing plate is measured in terms of the value of the stress required to separate a steel foot covered with a 1 $cm^2$ sheet of polyethylene terephthalate which has been forced onto the surface of a sample plate using an Omega force meter model DFG-2 obtained from Omega Engineering Inc. The particulars of the method for measuring the surface tack as mentioned above are described below. A printing plate is attached to a level support in such a manner that the relief face of the plate is directed upward. A steel foot of 0.25 inches in radius, attached to the digital force gauge, is brought into contact with the plain portion of the relief face of the plate. A load of 500 g is applied to the steel foot as measured with an Omega force meter, and allowed to stand for 10 seconds. Then, the foot is lifted upward by means of a platform motor at a constant elevation speed of 2 in./min until the plate is separated from the foot. The value of the stress just before the separation of the foot from the plate is measured using the Omega force meter. The value of the surface tack is obtained by dividing the value as measured above by the area in $cm^2$ of the polyester sheet, which in this case is 1 $cm^2$.

Each of the photopolymerizable compositions of the following examples was formed into a photopolymer printing plate according to the following procedure. Using a Merigraph® type 50 exposure unit (Hercules Incorporated, Wilmington, Del.), a 0.125" thick layer of the photosensitive resin composition was formed as a layer between an adhesive coated polyester backing sheet and a cover sheet of polypropylene film, which separated the photo resin from a photographic negative. The photopolymer was subjected to a back-side exposure of 1:30 minutes (90 seconds), followed by an imaging exposure through the negative for 4:00 minutes. After the exposure, the cover sheet was removed and the uncured resin was removed by spray washing with an aqueous solution containing 2% by weight Merigraph® washout detergent 1695 (trade name of ionic detergent sold by Hercules Incorporated) and 2% by weight sodium triphosphate at 35–40° C. for ten minutes to obtain a relief plate. Then the plate was immersed in an aqueous solution of sodium bisulfite and subjected to postexposure by actinic radiation having a minimum intensity of 8 $Mw/cm^2$ to completely cure the relief portion of the plate. The plate was then dried for 30 minutes at 40° C. Further, the plate may be subjected to a dry post-exposure step under germicidal lights for 10 minutes. The Shore A hardness and Bayshore resilience of each plate was measured as described above.

EXAMPLE 1

To a mixture of 500 parts by weight of poly(1,2-butylene oxide) (molecular weight 2000) (Dow Chemical Company, Midland, Mich.) and 1000 parts by weight of a triblock copolymer of ethylene oxide and propylene oxide (Poly G 55-53, Olin Corporation, Stamford, Conn.), having 30% ethylene oxide present as the end blocks (molecular weight 2000) was added 148 parts by weight of a 65:35 mixture of the 2,4- and 2,6-isomers of toluene diisocyanate (TDI) (Mondur TD, Miles Incorporated, Pittsburgh, Pa.) and dibutyltin dilaurate (20 ppm). The resulting mixture was reacted at 60° C. for 1.5 hours to obtain a polyurethane oligomer having isocyanate groups at both ends of the molecule (an intermediate oligomer). To this was added 225 parts by weight of polypropyleneglycol monomethacrylate (International Specialty Products, Wayne, N.J., molecular weight: 380) after which the reaction mixture was stirred at 80° C. until no residual isocyanate could be determined by titration with di-n-butylamine, to produce a urethane oligomer.

To 75 grams of this urethane oligomer were added 10 grams of laurylmethacrylate, (SR 313, Sartomer Company, Exton, Pa.) 12 grams of polypropyleneglycol monomethacrylate, (International Specialty Products, Wayne, N.J.) 2 grams of trimethylolpropane trimethacrylate, (SR 350, Sartomer Company, Exton, Pa.) 2 grams of tetraethyleneglycol dimethacrylate, (SR 209, Sartomer Company, Exton, Pa.) 0.3 gram 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 25 with a Bayshore resilience of 40%.

EXAMPLE 2

To a mixture of 500 parts by weight of poly(1,2-butylene oxide) (molecular weight 2000) (Dow Chemical Company, Midland, Mich.) and 1000 parts by weight of a triblock copolymer of ethylene oxide and propylene oxide, having 30% ethylene oxide present as the end blocks (molecular weight 2000) (Poly G 55-53, Olin Corporation, Stamford, Conn.) was added 212 parts by weight of methylene diphenyl diisocyanate (MDI, Miles Inc., Pittsburgh, Pa.) and dibutyltin dilaurate (20 ppm). The resulting mixture was reacted at 60° C. for 1.5 hours to obtain an intermediate polyurethane oligomer having isocyanate groups at both ends of the molecule. To this was added 234 parts by weight of polypropyleneglycol monomethacrylate (molecular weight: 380) (International Specialty Products, Wayne, N.J.) as the capping agent, after which the reaction mixture was stirred at 80° C. until no residual isocyanate could be determined by titration with di-n-butylamine, to produce a urethane oligomer.

To 75 grams of the urethane oligomer were added 10 grams of laurylmethacrylate, 12 grams of polypropyleneglycol monomethacrylate, 2 grams of trimethylolpropane trimethacrylate, 2 grams of tetraethyleneglycol dimethacrylate, 0.3 gram 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 24 and a Bayshore resilience of 43%.

EXAMPLE 3

The procedure of Example 1 was followed, except that 154 parts by weight of the mixture of 2,4- and 2,6-toluene diisocyanate and, for the capping agent, 226 parts by weight of polypropyleneglycol monomethacrylate were used to prepare the urethane oligomer.

To 73 grams of this oligomer were added 4 grams of laurylmethacrylate, 12 grams of polypropyleneglycol monomethacrylate, 7 grams of phenoethoxyacrylate (Photomer 4039, Henkel Corporation, Ambler Pa.), 0.7 gram of trimethylolpropane trimethacrylate, 0.6 gram of tetraethyleneglycol dimethacrylate, 0.3 gram 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 32 and a Bayshore resilience of 41%.

EXAMPLE 4

The procedure of Example 2 was followed, except that 222 parts by weight of the methylene diphenyldiisocyanate (MDI) and 235 parts by weight of polypropyleneglycol monomethacrylate were used to prepare the urethane oligomer.

To 74 grams of the urethane oligomer were added 2 grams of laurylmethacrylate, 7 grams of polypropyleneglycol monomethacrylate, 6 grams of phenoethoxyacrylate, 2.0 grams of trimethylolpropane trimethacrylate 0.5 gram 2,2-dimethoxy-2-phenylacetophenone and 0.2 gram of BHT. The resulting mixture was stirred for 2 hours to obtain a photosensitive resin composition. After exposure, washout and aqueous post-exposure, the plate prepared from the photosensitive resin composition had a Shore A hardness of 34 and a Bayshore resilience of 44%.

EXAMPLE 5

The procedure of Example 3 was followed, except that 75 parts by weight hydroxyproplymethacrylate (Sartomer Co., Exton, Pa.) and 151 parts by weight of polypropyleneglycol monomethacrylate were used as the capping agent to prepare the urethane oligomer.

To 74 grams of the urethane oligomer were added 2 grams of laurylmethacrylate, 6 grams of polypropyleneglycol monomethacrylate, 7 grams of phenoethoxyacrylate, 7 grams of polyethyleneoxydiacrylate (SR 252, Sartomer Co., Exton, Pa.), 0.5 gram 2,2-dimethoxy-2-phenylacetophenone and 0.2 gram of BHT. The resulting mixture was stirred for 2 hours to obtain a photosensitive resin composition. After exposure, washout and aqueous post-exposure, the plate prepared from the photosensitive resin composition had a Shore A hardness of 33 and a Bayshore resilience of 43%.

EXAMPLE 6

The procedure of Example 2 was followed, except that 219 grams of methylenediphenyl diisocyanate was used and 235 grams of acrylated caprolactone dimer (Tone M-100; Union Carbide Corp., Danbury Conn.) was used as the capping agent to prepare the urethane oligomer.

To 75 grams of the urethane oligomer were added 10 grams of laurylmethacrylate, 12 grams of polypropyleneglycol monomethacrylate, 2 grams of trimethylolpropane trimethacrylate, 2 grams of tetraethyleneglycol dimethacrylate, 0.3 gram 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 35 and a Bayshore resilience of 44%.

EXAMPLE 7

The procedure of Example 4 was followed, except that 226 grams of methylenediphenyl diisocyanate was used and 236 grams of acrylated caprolactone dimer (Tone M-100; Union Carbide Corp., Danbury Conn.) was used as the capping agent to prepare the urethane oligomer.

To 75 grams of the urethane oligomer were added 11 grams of laurylmethacrylate, 12 grams of polypropyleneglycol monomethacrylate, 0.7 gram of trimethylolpropane trimethacrylate, 0.7 gram of tetraethyleneglycol dimethacrylate, 0.3 gram 2,2-dimethoxy-2-phenylacetophenone and 0.2 gram of BHT. The resulting mixture was stirred for 2 hours to obtain a photosensitive resin composition. After exposure, washout, and aqueous post-exposure, the plate prepared with the photosensitive resin composition had a Shore A hardness of 30 and a Bayshore resilience of 43%.

EXAMPLE 8

The procedure of Example 2 was followed, except that 231 parts by weight of methylenediphenyl diisocyanate (MDI) and 259 parts by weight of polypropyleneglycol monomethacrylate were used to prepare the urethane oligomer.

To 84 grams of the urethane oligomer were added 8 grams of laurylmethacrylate, 4 grams of polypropyleneglycol monomethacrylate, 1 gram of trimethylolpropane trimethacrylate, 1.5 gram of tetraethyleneglycol dimethacrylate, 1.25 grams 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 38 and a Bayshore resilience of 46%.

EXAMPLE 9

The procedure of Example 1 is followed, except that 184 parts by weight of 2,2,4-trimethylhexamethylene diisocyanate (TMHDI) (Huls America Inc., Piscataway, N.J.) and 230 parts by weight of polypropyleneglycol monomethacrylate were used to prepare the urethane oligomer.

To 74 grams of the urethane oligomer were added 5 grams of laurylmethacrylate, 8 grams of polypropyleneglycol monomethacrylate, 7 grams of phenoethoxyacrylate, 0.6 gram of tetraethyleneglycol dimethacrylate, 0.5 gram 2,2-dimethoxy-2-phenylacetophenone and 0.1 gram of BHT. The resulting mixture was stirred for 2 hours to obtain a photosensitive resin composition. After exposure, washout and aqueous post-exposure, the plate prepared from the photosensitive resin composition had a Shore A hardness of 23 and a Bayshore resilience of 40%.

EXAMPLES 10–12 and COMPARATIVE EXAMPLE C1

The procedure of Example 1 was followed except that 2 moles (assuming a molecular weight of 2,000) of various mixtures of polybutylene oxide (Dow Chemical Co., Midland, Mich.) and an ethylene oxide/propylene oxide block copolymer (Poly G 55-53, Olin Corporation, Stamford, Conn.) as set forth in the accompanying Table 1 were reacted with 2.4 moles of a 65:35 mixture of the 2,4- and 2,6-isomers of toluene diisocyanate and capped with 600 grams of polypropyleneglycol monomethacrylate. The photosensitive resin composition of Comparative Example 1 ("C1") contained 0% polybutylene oxide in the polyether diol.

The liquid photosensitive resins were cured by exposure to actinic radiation to form sheets 0.040" thick which were then cut into circles having a diameter of 1". These circles were then weighed and immersed in water for 24 hours, followed by measurement of the weight gain due to swelling. The results for the samples are summarized in TABLE 1.

TABLE 1

| EXAMPLE | WT % POLYBUTYLENE OXIDE IN POLYETHER DIOL | HARDNESS | BAYSHORE RESILIENCE | SWELL AFTER 24 HRS IN $H_2O$ |
|---|---|---|---|---|
| 10 | 100 | 30 | 42 | 0.80% |
| 11 | 50 | 31 | 47 | 3.7% |
| 12 | 33 | 32 | 46 | 6.0% |
| C1 | 0 | 33 | 47 | 15.1% |

EXAMPLES 13–17

Examples 13–17 illustrate several photosensitive resin compositions which are liquids at room temperature, and even after freezing to −10° C. for 16 hours, become completely redissolved and transparent at less than +20° C., and preferably less than +15° C.

Photosensitive resins were prepared by blending 75 grams of the indicated oligomer with 10 grams of laurylmethacrylate, 12 grams of polypropyleneglycol monomethacrylate, 2 grams of trimethylolpropane trimethacrylate, 2 grams of tetraethyleneglycol dimethacrylate, 0.3 gram 2,2-dimethoxy-2-phenylacetophenone and 0.1 gram of BHT. The photosensitive resins were then blended with various amounts of slip additives as indicated in TABLE 2, after which the temperatures at which the samples froze, and then became clear were determined.

TABLE 2

| EXAMPLE | 13 | 14 | 15 | 16 | 17 |
|---|---|---|---|---|---|
| Oligomer from Example: | 6 | 6 | 10 | 10 | 6 |
| % Myristic acid | 1 | 2 | 1 | 2 | 2 |
| % Oleamide | 1 | 1 | 1 | 1 | 0 |
| % DMTDP* | 0.1 | 0.2 | 0.1 | 0.2 | 0 |
| % LTDP** | 0 | 0 | 0 | 0 | 0.5 |
| Freeze temperature (° C.) | <−10 | <−10 | <−10 | <−10 | <−10 |
| Clear temperature (° C.) | +15 | +18 | +12 | +19 | +12 |

*Dimyristyl thiodipropionate
**Lauryl thiodipropionate

EXAMPLE 18

To 750 grams of the urethane oligomer prepared as in Example 1 were added 35 grams of phenoethoxyacrylate, 105 grams of polypropyleneglycol monomethacrylate, 73 grams of laurylmethacrylate, 4 grams of propoxylated trimethylolpropane triacrylate (SR 492, Sartomer Company, Exton, Pa.), 6 grams of tetraethyleneglycol dimethacrylate, 10 grams of myristic acid, 10 grams of oleamide, 1 gram of dimyristyl thiodipropionate, 3 grams of 2,2-dimethoxy-2-phenylacetophenone and 2 grams of BHT. The resulting mixture was stirred for 2 hours to obtain a photosensitive resin composition.

After exposure, washout and aqueous post-exposure, the plate prepared from the photosensitive resin composition had a Shore A hardness of 26, a Bayshore resilience of 40% and a surface tack of 127 grams/cm². The flexible printing plate thus obtained was used to print 10,000 corrugated boxes without interruption for cleaning of the plates. At the conclusion of this printing run, the plates exhibited no buildup of paper fiber or dust, or dried ink residue on the surface or any of the edges of the relief image.

EXAMPLE 19

To 730 grams of the urethane oligomer of example 3 were added 74 grams of phenoethoxyacrylate, 115 grams of polypropyleneglycol monomethacrylate, 30 grams of laurylmethacrylate, 7 grams of trimethylolpropane trimethacrylate, 6 grams of tetraethyleneglycol dimethacrylate, 10 grams of myristic acid, 20 grams of oleamide, 2 gram of dimyristyl thiodipropionate, 3 grams of 2,2-dimethoxy-2-phenylacetophenone and 2 grams of BHT. The resulting mixture was stirred for 2 hours to obtain a photosensitive resin composition.

After exposure, washout and aqueous post-exposure, the plate prepared from the photosensitive resin composition had a Shore A hardness of 32, a Bayshore resilience of 41% and a surface tack of 14 grams/cm$^2$. The flexible printing plate thus obtained was used to print 10,000 corrugated boxes without interruption for cleaning of the plates. At the conclusion of this printing run, the plates exhibited no buildup of paper fiber or dust, or dried ink residue on the surface or any of the edges of the relief image.

EXAMPLE 20

To 760 grams of the urethane oligomer prepared as in Example 1 were added 50 grams of phenoethoxyacrylate, 90 grams of polypropyleneglycol monomethacrylate, 50 grams of laurylmethacrylate, 10 grams of propoxylated trimethylolpropane triacrylate, 8 grams of tetraethyleneglycol dimethacrylate, 10 grams of myristic acid, 10 grams of oleamide, 1 gram of dimyristyl thiodipropionate, 14 grams of 2,2-dimethoxy-2-phenylacetophenone and 1 gram of BHT. The resulting mixture was stirred for 2 hours to obtain a photosensitive resin composition.

After exposure, washout and aqueous post-exposure, the plate prepared from the photosensitive resin composition had a Shore A hardness of 25, a Bayshore resilience of 38% and a surface tack of 90 grams/cm$^2$. The flexible printing plate thus obtained was used to print 45,000 corrugated boxes made from 100% recycled Kraft paper without interruption for cleaning of the plates. At the conclusion of this printing run, the plates exhibited no buildup of paper fiber or dust, or dried ink residue on the surface or any of the edges of the relief image.

Comparative Examples 2–5 illustrate photosensitive resin compositions which comprise polyurethane oligomers prepared from polyether diol compounds wherein 34% of the polyether diol was polyTHF.

COMPARATIVE EXAMPLE 2

To a mixture of 500 parts by weight of polytetramethylene glycol ether (molecular weight 2000) (Terathane 2000, E. I. duPont deNemours and Company, Inc. Wilmington, Del.) and 960 parts by weight of a triblock copolymer of ethylene oxide and propylene oxide, having 30% ethylene oxide present as the end blocks (molecular weight 2000) (Poly G 55-53, Olin Corporation, Stamford, Conn.) was added 159 parts by weight of a 65/35 mixture of the 2,4-and 2,6-isomers of toluene diisocyanate (TDI) (Miles Inc., Pittsburgh, Pa.) and dibutyltin dilaurate (20 ppm). The resulting mixture was reacted at 60° C. for 1.5 hours to obtain an intermediate polyurethane oligomer having isocyanate groups at both ends of the molecule. To this was added 630 parts by weight of polypropylene monomethacrylate (molecular weight: 380) after which the reaction mixture was stirred at 80° C. until no residual isocyanate could be determined by titration with n-butylamine. The resulting urethane oligomer had a melting point range of 30–32° C.

To 75.6 grams of the urethane oligomer were added 5 grams of laurylmethacrylate, 6 grams of polypropyleneglycol monomethacrylate, 8 grams of phenoethoxy methacrylate, 1.5 grams of propoxylated trimethylolpropane trimethacrylate, 1 gram of tetraethyleneglycol dimethacrylate, 0.3 gram 2,2-dimethoxy-2-phenylacetophenone, 2 grams of myristic acid, 0.5 gram of lauryl thiodipropionate, and 0.1 gram of BHT. The resulting mixture was stirred for 2 hours to obtain a photosensitive resin composition.

After freezing to −10° C. for 16 hours, heating to +24° C. was required to thaw the resin, and heating to +30° C. was required to redissolve all the crystallized elements of the resin, as shown in TABLE 3.

COMPARATIVE EXAMPLE 3

To 76 grams of the urethane oligomer from Comparative Example 1 were added 5 grams of laurylmethacrylate, 6 grams of polypropyleneglycol monomethacrylate, 8 grams of phenoethoxy methacrylate, 1.5 grams of propoxylated trimethylolpropane trimethacrylate, 1 gram of tetraethyleneglycol dimethacrylate, 0.3 gram 2,2-dimethoxy-2-phenylacetophenone, 1 gram of myristic acid, 1 gram of oleamide, 0.1 gram of dimyristyl thiodipropionate, and 0.1 gram of BHT and the resulting mixture was stirred for 2 hours to obtain a photosensitive resin composition.

After freezing to −10° C. for 16 hours, heating to +24° C. was required to thaw the resin, and heating to +30° C. was required to redissolve all the crystallized elements of the resin, as shown in TABLE 3.

COMPARATIVE EXAMPLE 4

To 74.9 grams of the oligomer prepared as in Comparative Example 1 were added 5 grams of laurylmethacrylate, 6 grams of polypropyleneglycol monomethacrylate, 8 grams of phenoethoxy methacrylate, 1.5 grams of propoxylated trimethylolpropane trimethacrylate, 1 gram of tetraethyleneglycol dimethacrylate, 0.3 gram 2,2-dimethoxy-2-phenylacetophenone, 2 grams of myristic acid, 1 gram of oleamide, 0.2 gram of dimyristyl thiodipropionate, and 0.1 gram of BHT. The resulting mixture was stirred for 2 hours to obtain a photosensitive resin composition.

After freezing to −10° C. for 16 hours, heating to +24° C. was required to thaw the resin, and heating to +30° C. was required to redissolve all the crystallized elements of the resin, as shown in TABLE 3.

COMPARATIVE EXAMPLE 5

To 75 grams of the oligomer from Comparative Example 1 were added 5 grams of laurylmethacrylate, 6 grams of polypropyleneglycol monomethacrylate, 8 grams of phenoethoxy methacrylate, 1.5 grams of propoxylated trimethylolpropane trimethacrylate, 1 gram of tetraethyleneglycol dimethacrylate, 0.3 gram 2,2-dimethoxy-2-phenylacetophenone, and 0.1 gram of BHT and the resulting mixture was stirred for 2 hours to obtain a photosensitive resin composition.

After freezing to −10° C. for 16 hours, heating to +27° C. was required to thaw the resin, and heating to +30° C. was required to redissolve all the crystallized elements of the resin, as shown in TABLE 3.

TABLE 3

| COMPARATIVE EXAMPLE | THAW TEMPERATURE (° C.) | CLEAR SOLUTION TEMPERATURE (° C.) |
|---|---|---|
| 2 | +24 | +30 |
| 3 | +24 | +30 |
| 4 | +24 | +30 |
| 5 | +27 | +30 |

COMPARATIVE EXAMPLE 6

To a mixture of 380 parts by weight of polypropylene adipate (molecular weight 2400) (Rucoflex S-108, Ruco Polymer Corporation, Hicksville, N.Y.) and 380 parts by weight of a triblock copolymer of ethylene oxide and propylene oxide, having 30% ethylene oxide present as the end blocks (molecular weight 2000) (Poly G 55-53, Olin Corporation, Stamford Conn.) was added 79 parts by weight of 2,2,4-trimethylhexamethylene diisocyanate and dibutyltin dilaurate (120 ppm). The resulting mixture was reacted at 60° C. for 4 hours to obtain an intermediate polyurethane oligomer having isocyanate groups at both ends of the molecule. To this was added 109 parts by weight 2-hydroxypropyl methacrylate and 47 parts by weight of polypropyleneglycol monomethacrylate (molecular weight: 380) after which the reaction mixture was stirred at 80° C. until no residual isocyanate could be determined by titration with di-n-butylamine, to obtain a urethane oligomer.

To 750 grams of the urethane oligomer were added 97 grams of laurylmethacrylate, 104 grams of polypropyleneglycol monomethacrylate, 10 grams of trimethylolpropane triacrylate, 16 grams of tetraethyleneglycol dimethacrylate, 10 grams of myristic acid, 10 grams of oleamide, 1 gram of dimyristyl thiodipropionate, 3 grams of 2,2-dimethoxy-2-phenylacetophenone, and 1 gram of BHT. After exposure, washout and aqueous post-exposure, the plate prepared from the photosensitive resin composition had a Shore A hardness of 26, a Bayshore resilience of 19% and a surface tack of 100 grams/cm². The flexible printing plate thus obtained was used to print 10,000 corrugated boxes as in examples 19 and 20. The printing press had to be stopped to clean the plates after printing 6700 boxes. At the conclusion of this printing run, the plates exhibited significant buildup of paper fiber and dust, and dried ink residue on the printing surface and at the edges of the relief areas.

COMPARATIVE EXAMPLE 7

To 765 grams of the urethane oligomer prepared as in Comparative Example 6 were added 91 grams of laurylmethacrylate, 97 grams of polypropyleneglycol monomethacrylate, 9 grams of trimethylolpropane triacrylate, 6 grams of tetraethyleneglycol dimethacrylate, 20 grams of myristic acid, 6 grams of lauryl thiodipropionate, 3 grams of 2,2-dimethoxy-2-phenylacetophenone, and 1 gram of BHT. After exposure, washout and aqueous post-exposure, the plate prepared from the photosensitive resin composition had a Shore A hardness of 25, a Bayshore resilience of 18% and a surface tack of 85 grams/cm². The flexible printing plate thus obtained was used to print 45,000 corrugated boxes as in Example 20. The printing press had to be stopped to clean the plates after printing 13,000 boxes, and several times subsequently thereafter. At the conclusion of this printing run, the plates exhibited significant buildup of paper fiber and dust, and dried ink residue on the printing surface and at the edges of the relief areas.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A photosensitive resin composition comprising
   (i) a urethane oligomer;
   (ii) an ethylenically unsaturated compound; and
   (iii) a photopolymerization initiator;
   wherein said urethane oligomer is the reaction product of (a) polyether diol compounds X and Y, (b) a polyisocyanate, and (c) a hydroxy-functionalized acrylate or methacrylate, wherein
   diol compound X has the formula H—(—O—R$^1$)$_m$—OH wherein R$^1$ is independently selected from the group consisting of ethylene and iso-propylene, m is an integer between 5–100 inclusive, and wherein the diol compound X has a majority of iso-propylene R$^1$ units in relation to the total R$^1$ units; and
   diol compound Y has the formula H—(O—R$^2$—)$_n$—OH wherein R$^2$ is independently selected from the group consisting of ethylene, propylene, butylene, ethylene branch substituted with 0–5 C$_1$–C$_4$ aliphatic groups, propylene branch substituted with 0–5 C$_1$–C$_4$ aliphatic groups, butylene branch substituted with 0–5 C$_1$–C$_4$ aliphatic groups and mixtures thereof, n is an integer between 5–100 inclusive, the total number of carbon atoms in Y divided by n is at least 3.5, diol compound Y has a melting point equal to or less than 22° C., and Y contributes at least 15 weight percent of the polyether diol compounds x and y.

2. The composition of claim 1 wherein diol compound X has 15–50 weight percent ethylene R$^1$ units and 85–50 weight percent iso-propylene R$^1$ units, based on the total weight of R$^1$ units.

3. The composition of claim 1 wherein diol compound X is a block copolymer.

4. The composition of claim 1 wherein diol compound Y is poly(1,2-butylene oxide).

5. The composition of claim 1 wherein diol compound Y comprises about 15 to about 75 weight percent of the diol compounds X and Y.

6. The composition of claim 1 wherein diol compound X and diol compound Y independently have a number average molecular weight of about 500 to about 5,000.

7. The composition of claim 1 wherein the polyisocyanate is selected from the group consisting of aliphatic and aromatic diisocyanates.

8. The composition of claim 7 wherein the aliphatic diisocyanate is selected from the group consisting of hexamethylene diisocyanate, trimethylhexamethylene diisocyanate and bis-cyclohexylmethylene diisocyanate and the aromatic diisocyanate is selected from the group consisting of toluene diisocyanate, methylene diphenyldiisocyanate and xylylene diisocyanate.

9. The composition of claim 1 wherein the hydroxy-functionalized acrylate or methacrylate is selected from the group consisting of hydroxypropyl methacrylate, polypropylene glycol monomethacrylate, polypropylene glycol monoacrylate, and acrylated caprolactone oligomers.

10. The composition of claim 1 wherein the diol compound X is a block copolymer comprising 15–50 weight percent ethylene $R^1$ units and 85–50 weight percent isopropylene $R^1$ units, based on the total weight of $R^1$ units, the diol compound Y is poly(1,2-butylene oxide), the polyisocyanate is selected from the group consisting of hexamethylene diisocyanate, trimethylhexamethylene diisocyanate and bis-cyclohexylmethylene diisocyanate, toluene diisocyanate, methylene diphenyldiisocyanate and xylylene diisocyanate, and the hydroxy-functionalized acrylate or methacrylate is selected from the group consisting of hydroxypropyl methacrylate, polypropylene glycol monomethacrylate, polypropylene glycol monoacrylate and acrylated caprolactone oligomers.

11. The composition of claim 1 wherein the compound (ii) is selected from the group consisting of mono-ester of $C_1$–$C_{22}$ monoalcohol and acrylic acid, mono-ester of $C_1$–$C_{22}$ monoalcohol and methacrylic acid, mono- and di-ester of $C_2$–$C_{22}$ dialcohols and acrylic acid, mono- and di-ester of $C_2$–$C_{22}$ dialcohols and methacrylic acid, mono-, di- and tri-esters of $C_3$–$C_{22}$ trialcohols and acrylic acid, mono-, di- and tri-esters of $C_3$–$C_{22}$ trialcohols and methacrylic acid, and oligomeric polybutadienes having photopolymerizable olefinic double bonds.

12. The composition of claim 11 wherein the compound (ii) is selected from the group consisting of lauryl acrylate, lauryl methacrylate, isodecyl acrylate, isodecyl methacrylate, polypropyleneglycol acrylate, polypropyleneglycol methacrylate, polypropyleneglycol diacrylate, polypropyleneglycol dimethacrylate, trimethylolpropane triacrylate, trimethylolpropane trimethacrylate, tri(methylolpropane polypropylene oxide) triacrylate and tri(methylolpropane polypropylene oxide) trimethacrylate.

13. The composition of claim 1 wherein the compound (ii) is present in from about 10 to about 35 weight percent of the photosensitive resin composition.

14. The composition of claim 1 wherein the diol compound X is a block copolymer comprising 15–50 weight percent ethylene $R^1$ units and 85-50 weight percent isopropylene $R^1$ units, based on the total weight of $R^1$ units, the diol compound Y is poly(1,2-butylene oxide), the polyisocyanate is selected from the group consisting of hexamethylene diisocyanate, trimethylhexamethylene diisocyanate and bis-cyclohexylmethylene diisocyanate, toluene diisocyanate, methylene diphenyldiisocyanate and xylylene diisocyanate, the hydroxy-functionalized acrylate or methacrylate is selected from the group consisting of hydroxypropyl methacrylate, polypropylene glycol monomethacrylate, polypropylene glycol monoacrylate and acrylated caprolactone oligomers, and the compound (ii) is selected from the group consisting of lauryl acrylate, lauryl methacrylate, isodecyl acrylate, isodecyl methacrylate, polypropyleneglycol acrylate, polypropyleneglycol methacrylate, polypropyleneglycol diacrylate, polypropyleneglycol dimethacrylate, trimethylolpropane triacrylate, trimethylolpropane trimethacrylate, tri(methylolpropane polypropylene oxide) triacrylate and tri(methylol propane-polypropylene oxide) trimethacrylate.

15. The composition of claim 1 wherein the compound (ii) comprises a mixture of a first component selected from the group consisting of monoacrylate ester and monomethacrylate ester, and a second component selected from the group consisting of polyacrylate ester and polymethacrylate ester.

16. The composition of claim 15 wherein the mixture comprises about 1% to about 20% of said second component, based on the total weight of said mixture.

17. The composition of claim 1 wherein the urethane oligomer has a number average molecular weight of about 6,000 to about 20,000.

18. The composition of claim 1 wherein the urethane oligomer has a melting point equal to or less than 22° C.

19. The composition of claim 1 wherein the urethane oligomer has a melting point equal to or less than 15° C.

20. The composition of claim 1 having a melting point equal to or less than 22° C.

21. The composition of claim 1 having a melting point equal to or less than 15° C.

22. The composition of claim 1 wherein the photosensitive resin composition has a viscosity of about 10,000 cps to about 100,000 cps at 22° C.

23. The composition of claim 1 wherein the photosensitive resin composition contains an additive selected from the group consisting of a stabilizer and a slip additive.

* * * * *